(12) United States Patent
Pandey et al.

(10) Patent No.: US 10,622,056 B2
(45) Date of Patent: Apr. 14, 2020

(54) APPARATUSES HAVING COMPENSATOR LINES ALONG WORDLINES AND INDEPENDENTLY CONTROLLED RELATIVE TO THE WORDLINES

(71) Applicant: Micron Technology, Inc., Boise, ID (US)

(72) Inventors: Deepak Chandra Pandey, Boise, ID (US); Chandra Mouli, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/250,919

(22) Filed: Jan. 17, 2019

(65) Prior Publication Data
US 2019/0172520 A1 Jun. 6, 2019

Related U.S. Application Data

(62) Division of application No. 15/633,595, filed on Jun. 26, 2017, now Pat. No. 10,304,518.

(51) Int. Cl.
| | |
|---|---|
| *G11C 11/408* | (2006.01) |
| *H01L 23/528* | (2006.01) |
| *H01L 23/532* | (2006.01) |
| *H01L 27/108* | (2006.01) |
| *G11C 8/08* | (2006.01) |
| *G11C 8/14* | (2006.01) |

(52) U.S. Cl.
CPC ........... *G11C 11/4085* (2013.01); *G11C 8/08* (2013.01); *G11C 8/14* (2013.01); *H01L 23/528* (2013.01); *H01L 23/5329* (2013.01); *H01L 23/53257* (2013.01); *H01L 27/10805* (2013.01); *H01L 27/10811* (2013.01); *H01L 27/10823* (2013.01); *H01L 27/10891* (2013.01)

(58) Field of Classification Search
CPC ........................ H01L 23/528; G11C 11/4085
See application file for complete search history.

(56) References Cited

U.S. PATENT DOCUMENTS

| | | | |
|---|---|---|---|
| 5,933,387 A | 8/1999 | Worley | |
| 5,940,315 A | 8/1999 | Cowles | |
| 6,100,588 A | 8/2000 | McAdams et al. | |
| 6,180,453 B1 | 1/2001 | Sung et al. | |
| 2004/0056308 A1* | 3/2004 | Tomishima | H01L 21/84 257/347 |

(Continued)

*Primary Examiner* — Mushfique Siddique
(74) *Attorney, Agent, or Firm* — Wells St. John P.S.

(57) ABSTRACT

Some embodiments include an apparatus which has a wordline coupled with a transistor gate, and which has a compensator line extending along the wordline and spaced from the wordline by a dielectric region. A driver is coupled with the wordline, and a controller is coupled with the compensator line. The wordline is coupled with access transistors, and is operated at a first voltage while the access transistors are in an OFF state. The compensator line is operated at a second voltage while the wordline is at the first voltage; with the second voltage being greater than the first voltage. The wordline is operated at a third voltage while the access transistors are in an ON state, and the compensator line is operated at a fourth voltage while the wordline is at the third voltage. The third voltage may or may not be greater than the fourth voltage.

19 Claims, 3 Drawing Sheets

(56) References Cited

U.S. PATENT DOCUMENTS

| | | |
|---|---|---|
| 2006/0113587 A1 | 6/2006 | Thies et al. |
| 2007/0152263 A1 | 7/2007 | Chang et al. |
| 2007/0236979 A1* | 10/2007 | Takashima .............. G11C 11/22 365/145 |
| 2010/0195431 A1* | 8/2010 | Ohgami ................. G11C 5/063 365/230.06 |
| 2010/0297819 A1* | 11/2010 | Noble ............... H01L 27/10864 438/244 |
| 2013/0264621 A1* | 10/2013 | Nishi ............... H01L 27/10826 257/296 |
| 2014/0035018 A1* | 2/2014 | Lee ...................... H01L 29/945 257/302 |
| 2014/0247674 A1* | 9/2014 | Karda .................... G11C 11/40 365/189.011 |
| 2015/0048292 A1* | 2/2015 | Park ................... H01L 27/2454 257/2 |
| 2016/0049406 A1* | 2/2016 | Sandhu .............. H01L 21/8254 257/43 |
| 2018/0138182 A1 | 5/2018 | Goswami et al. |
| 2018/0182765 A1 | 6/2018 | Juengling |

\* cited by examiner

APPARATUSES HAVING COMPENSATOR LINES ALONG WORDLINES AND INDEPENDENTLY CONTROLLED RELATIVE TO THE WORDLINES

RELATED PATENT DATA

This patent resulted from a divisional of U.S. patent application Ser. No. 15/633,593 filed Jun. 26, 2017 and which is hereby incorporated by reference herein.

TECHNICAL FIELD

Apparatuses having compensator lines along wordlines and independently controlled relative to the wordlines.

BACKGROUND

Wordlines may be coupled with access transistors in memory arrangements. It may be desired to develop memory arrangements having numerous improvements; such as, for example, increased "on-current" along the wordlines, reduced leakage associated with access transistors, higher retention (less refresh rate) of memory cells coupled with the access transistors, etc. Unfortunately, it is difficult to provide such improvements while also scaling wordlines into increasingly tighter configurations associated with increasing levels of integration. Accordingly, it is desired to develop new designs which enable improvements in one or more of increased drive current, reduced leakage, increased refresh rate, etc., of highly-integrated memory arrangements.

DETAILED DESCRIPTION OF THE ILLUSTRATED EMBODIMENTS

Some embodiments include provision of compensator lines over wordlines, and spaced from the wordlines by dielectric regions. The wordlines extend across a memory array. The compensator lines are independently controlled relative to the wordlines, and may be utilized to tailor operational characteristics of the wordlines during utilization of the memory array. Such may lead to improvements of operational parameters of the memory array relative to conventional architectures lacking the compensator lines; with the improved operational parameters including, for example, one or more of increased on-current along the wordlines, reduced leakage of access transistors coupled with the wordlines, longer retention times (refresh less often) of memory cells within the memory array, etc. Example embodiments are described with reference to FIGS. 1-4.

Figure 1:
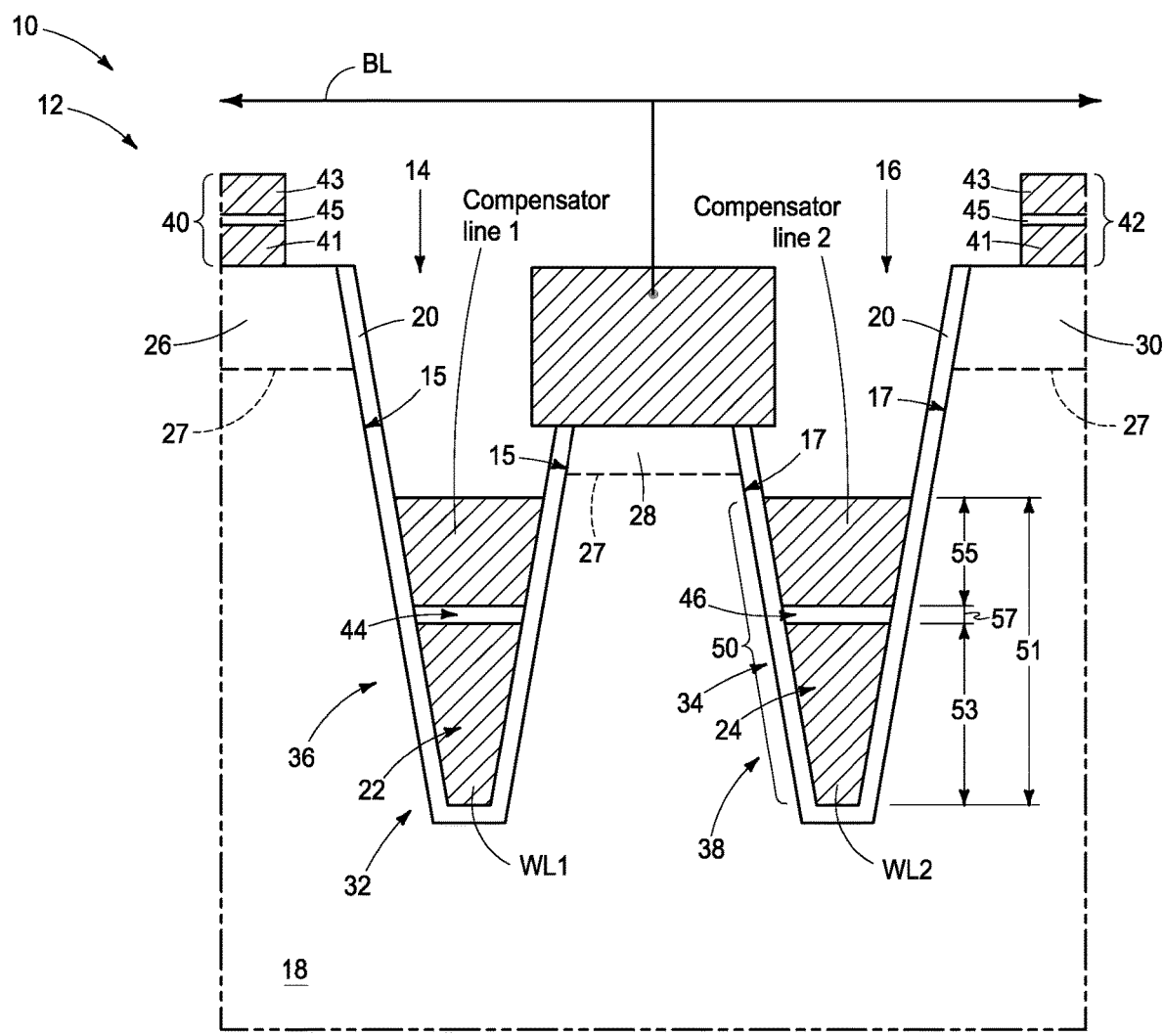
FIG. 1 is a diagrammatic cross-sectional side view of a construction comprising an example apparatus.

Referring to FIG. 1, a region of a construction 10 is illustrated. Such region may be a portion of a memory array in some embodiments. The illustrated region includes an apparatus 12 having first and second trenches 14 and 16 extending into a semiconductor material 18.

The semiconductor material 18 may, for example, comprise, consist essentially of, or consist of monocrystalline silicon and may be considered to be part of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The semiconductor material 18 may include any suitable composition(s), and in some applications the semiconductor material 18 may comprise IGZO (indium gallium zinc oxide), GaP (gallium phosphide), etc.

The trench 14 has sidewalls 15, and the trench 16 has sidewalls 17. The trenches 14 and 16 may have any suitable configurations. For instance, the sidewalls 15 and 17 may be sloped (as shown), vertical, or of any other suitable orientation.

The sidewalls 15 and 17 are lined with dielectric material 20. Such dielectric material may comprise any suitable composition or combination of compositions; and in some embodiments may comprise, consist essentially of, or consist of silicon dioxide. The dielectric material 20 may be incorporated into gate dielectric of access transistors, and accordingly in some embodiments may be referred to as gate dielectric material.

A first transistor gate 22 is within the first lined trench 14, and a second transistor gate 24 is within the second lined trench 16. The first transistor gate 22 is coupled with a first wordline WL1 which extends in and out of the page relative to the cross-sectional view of FIG. 1, and similarly the second transistor gate 24 is coupled with a second wordline WL2.

The wordlines WL1 and WL2, and associated transistor gates 22 and 24, may comprise any suitable electrically conductive composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

First, second and third source/drain regions 26, 28 and 30 are within the semiconductor material 18. The source/drain regions 26, 28 and 30 may comprise conductivity-enhancing dopant provided within the semiconductor material 18; and approximate bottom regions of the source/drain regions are diagrammatically illustrated utilizing dashed lines 27. The source/drain regions 26, 28 and 30 may be provided to any suitable depths within the semiconductor material 18. In some embodiments, the source/drain regions 26, 28 and 30 may all be provided to about the same depth as one another; and in other embodiments at least one of the source/drain regions 26, 28 and 30 may be provided to a different depth than at least one other of the source/drain regions 26, 28 and 30. For instance, in the shown embodiment the source/drain region 28 is provided to be deeper than the source/drain regions 26 and 30. The source/drain regions 26, 28 and 30 may include metal in some embodiments.

The first transistor gate 22 is between the first and second source/drain regions 26 and 28, and gatedly couples such source/drain regions to one another through a channel region 32 (with "gatedly coupling" referring to selective coupling of the source/drain regions through operation of a transistor gate). The second transistor gate 24 is between the second and third source/drain regions 28 and 30, and gatedly couples such source/drain regions to one another through a channel region 34. In some embodiments, the first transistor gate 22, together with the source/drain regions 26 and 28, may be considered to comprise a first access device (i.e., first access transistor) 36; and the second transistor gate 24, together with the source/drain regions 28 and 30, may be considered to comprise a second access device (i.e., second access transistor) 38. Notably, the source/drain region 28 is shared between the first and second access devices 36 and 38.

A first programmable structure 40 is electrically coupled with the first source/drain region 26, and a second programmable structure 42 is electrically coupled with the third source/drain region 30. The programmable structures 40 and 42 may comprise any suitable structures which may store data within a memory array. For instance, in the illustrated embodiment the programmable structures 40 and 42 comprise capacitors; and specifically comprise a pair of capacitor electrodes 41 and 43, spaced from one another by capacitor dielectric material 45. The capacitor dielectric material 45 may comprise traditional dielectric material, such as silicon nitride, silicon dioxide, etc.; and/or may comprise ferroelectric material.

The electrodes 41 and 43 may comprise any suitable electrically conductive composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The electrodes 41 and 43 may comprise the same composition as one another, or may comprise different compositions relative to one another.

The illustrated capacitors are examples of charge-storage structures, and in other embodiments the programmable structures 40 and 42 may comprise other suitable charge-storage structures.

A bitline BL is electrically coupled with the shared source/drain region 28. The bitline extends along the plane of the cross-sectional view of FIG. 1, as is diagrammatically illustrated.

The bitline BL may comprise any suitable electrically conductive composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

A first compensator line (compensator line 1) is within the first trench 14 and extends along the first wordline WL1; and a second compensator line (compensator line 2) is within the second trench 16 and extends along the second wordline WL2. Compensator line 1 is spaced from the first wordline WL1 by a first dielectric region 44, and compensator line 2 is spaced from the second wordline WL2 by a second dielectric region 46. The dielectric regions 44 and 46 may comprise any suitable dielectric composition or combination of compositions; and in some embodiments may comprise, consist essentially of, or consist of one or more oxides (e.g., hafnium oxide, zirconium oxide, aluminum oxide, silicon dioxide, etc.), silicon nitride, etc.

The compensator lines 1 and 2 are not electrically coupled to the wordlines WL1 and WL2. Rather, the compensator lines 1 and 2 are independently controlled relative to the wordlines WL1 and WL2, as discussed in more detail below with reference to FIG. 2.

Referring still to FIG. 1, the compensator lines 1 and 2 may comprise any suitable electrically conductive composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the compensator lines 1 and 2 may comprise, consist essentially of, or consist of one or both of tungsten and ruthenium. The compensator lines 1 and 2 may comprise a same composition as the wordlines WL1 and WL2, or may comprise different compositions relative to the wordlines WL1 and WL2.

Insulative material (not shown) would generally be provided over the compensator lines 1 and 2, around the programmable devices 40 and 42, and around the bitline BL; and would be utilized to assist in electrically isolating the bitline, programmable devices, and compensator lines from one another.

The access transistors 36 and 38 are example access transistors that may be formed along the wordlines WL1 and WL2. In some embodiments, the wordlines WL1 and WL2 are examples of many wordlines which extend across a memory array, and each of the wordlines may have multiple access transistors associated therewith. Also, the bitline BL may be an example of one of many bitlines formed across the memory array. Each of the programmable devices 40 and 42 may be considered to be representative of a memory cell within the memory array, and there may be hundreds, thousands, millions, billions, etc., of such memory cells included within the memory array.

The compensator lines 1 and 2 extend parallel to the underlying wordlines WL1 and WL2. In some embodiments, the compensator line and underlying wordline may be considered to form a stack. For instance, the compensator line 2, wordline WL2 and dielectric region 46 may be considered together to form a stack 50. The stack 50 has a vertical thickness 51, which may be referred to as a first vertical thickness, or as an overall vertical thickness. The wordline WL2 has a vertical thickness 53 (which may be referred to as a second vertical thickness), the compensator line 2 has a vertical thickness 55 (which may be referred to as a third vertical thickness), and the dielectric region 46 has a vertical thickness 57 (which may be referred to as a fourth vertical thickness). The various thickness may be any suitable thicknesses. In some embodiments, the first vertical thickness 51 is at least about 50 nanometers (nm), at least about 100 nm, etc. In some embodiments, the third vertical thickness 55 is within a range of from about 10% to about 50% of the first vertical thickness 51, and the fourth vertical thickness 57 is within a range of from about 0.5% to about 6% of the first vertical thickness 51.

Figure 2:
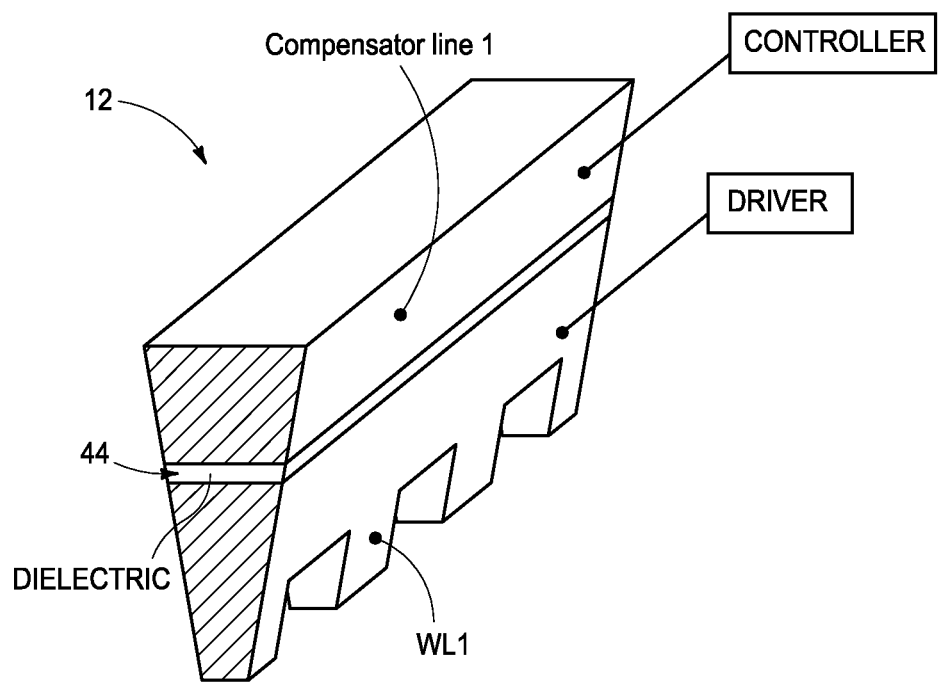
FIG. 2 is a three-dimensional view of a portion of the apparatus of FIG. 1.

FIG. 2 shows a portion of the apparatus 12 comprising the compensator line 1, wordline WL1 and dielectric region 44. The compensator line 1 can be seen to extend parallel with the wordline WL1. The wordline is electrically coupled with a driver which controls voltage along the wordline, and which ultimately determines if the gates associated with access transistors (e.g., the gate 22 associated with the access transistor 36 of FIG. 1) are in an ON state or an OFF state. The compensator line is electrically coupled with a controller which controls voltage along the compensator line. Although the compensator line is illustrated to be coupled with a controller, in some applications the compensator line may be allowed to electrically float, and thus need not be coupled to a controller; or may be held at electrical ground, and thus may be coupled with a grounded plate or other suitable structure.

The voltage along the compensator line is independently controlled relative to the voltage along the wordline. The voltage along the compensator line may be at any suitable level during operation of the wordline. In some embodiments, the compensator line may be utilized to adjust operational characteristics along the underlying wordline; which may be utilized to tailor the operational behavior of the wordline and/or associated access transistors. Such may enable performance characteristics of a memory array to be improved, or even optimized, in highly-integrated configurations. Although the compensator lines 1 and 2 are shown to be above the wordlines WL1 and WL2 in the embodiments of FIGS. 1 and 2, it is to be understood that in other embodiments the compensator lines may be laterally along the wordlines, under the wordlines, etc.

Figure 3:
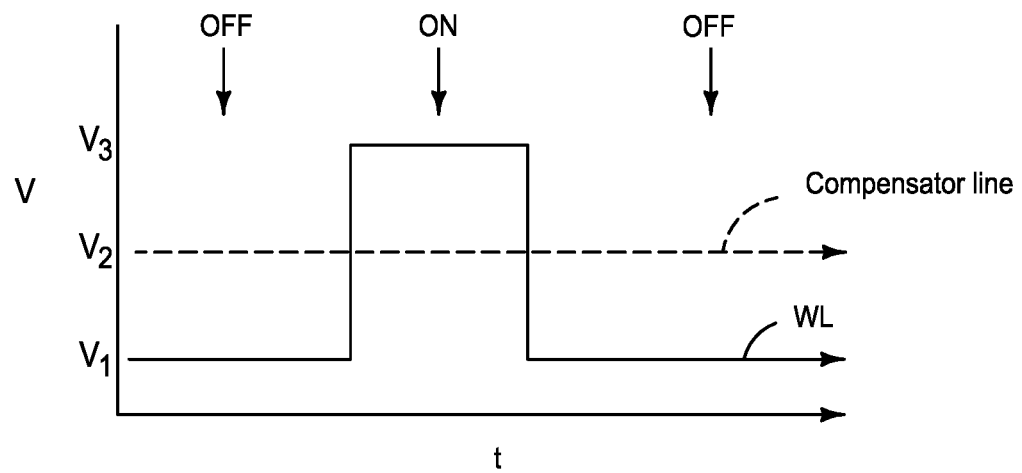
FIG. 3 is a graphical illustration of an example relationship of voltage (V) versus time (t) during example operational modes of an example apparatus.
Figure 4:
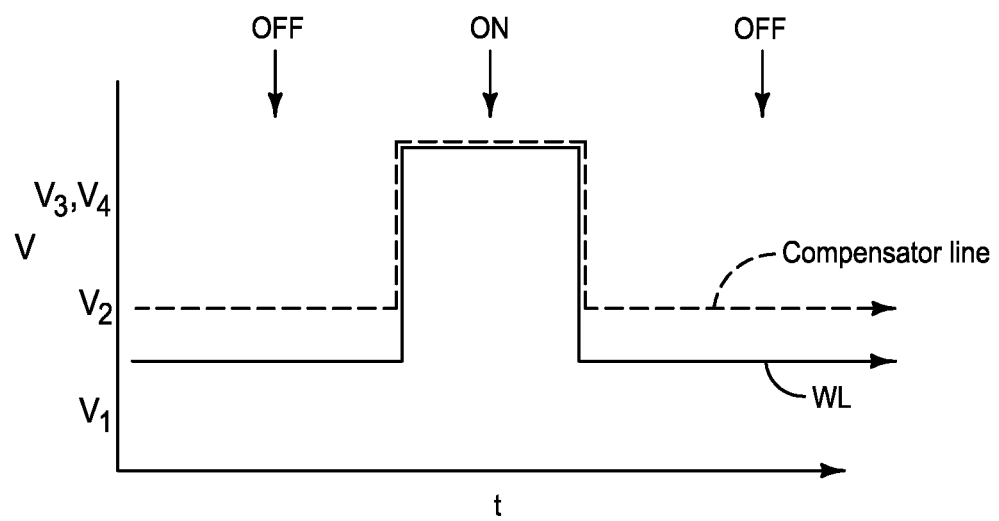
FIG. 4 is another graphical illustration of an example relationship of voltage (V) versus time (t) during example operational modes of an example apparatus.

FIGS. 3 and 4 illustrate example operational characteristics of a compensator line and an associated wordline (for instance, the compensator line 1 and the associated wordline WL1 of FIG. 2).

Referring to FIG. 3, the operational characteristics of the wordline WL are illustrated as a solid line, and graphically illustrated as voltage (V) versus time (t). Also, the operational characteristics of the compensator line are illustrated as a dashed line. The operational modes (OFF and ON) of access transistors along the wordline are indicated at various time intervals of the graph.

When the wordline is operated at a voltage $V_1$, the access transistors are in the OFF state; and when the wordline is operated at a voltage $V_3$, the access transistors are in the ON state. The compensator line is maintained at a voltage $V_2$, intermediate $V_1$ and $V_3$ at all times during operation of the wordline; regardless of whether the wordline is at voltage $V_1$ or $V_3$. In some embodiments, the voltages $V_1$, $V_2$ and $V_3$ may be referred to as first, second and third voltages, respectively. The wordline may be considered to be operated at the first voltage $V_1$ while the access transistors are in the OFF state, and the compensator line may be considered to be operated at the second voltage $V_2$ while the wordline is at the first voltage $V_1$; with the second voltage $V_2$ being greater than the first voltage $V_1$. Also, the wordline may be considered to be operated at the third voltage $V_3$ while the access transistors are in the ON state, and the compensator line may be considered to be remain at the second voltage $V_2$ while the wordline is at the third voltage $V_3$; with the third voltage $V_3$ being greater than the second voltage $V_2$.

Referring to FIG. 4, the operational characteristics of the wordline WL and the compensator line are illustrated relative to another example embodiment. Like the above-discussed embodiment of FIG. 3, the access transistors in the OFF state when the wordline is operated at the voltage $V_1$, and are in the ON state when the wordline is operated at the voltage $V_3$. The compensator line is at the voltage $V_2$ when the access transistors are in the OFF state, and is switched to a voltage $V_4$ when the access transistors are in the ON state. In the illustrated embodiment, the voltage $V_4$ is the same as the voltage $V_3$, but in other embodiments the voltages $V_3$ and $V_4$ may be different from one another. In some embodiments, the voltages $V_1$, $V_2$, $V_3$ and $V_4$ may be referred to as first, second, third and fourth voltages, respectively. The wordline may be considered to be operated at the first voltage $V_1$ while the access transistors are in the OFF state, and the compensator line may be considered to be operated at the second voltage $V_2$ while the wordline is at the first voltage $V_1$; with the second voltage $V_2$ being greater than the first voltage $V_1$. Also, the wordline may be considered to be operated at the third voltage $V_3$ while the access transistors are in the ON state, and the compensator line may be considered to be at the fourth voltage $V_4$ while the wordline is at the third voltage $V_3$; with the third voltage $V_3$ not being greater than the fourth voltage $V_4$ (although, in other embodiments the third voltage $V_3$ may be greater than the fourth voltage $V_4$).

The operational relationships between the compensator line and the associated wordline which are described with reference to FIGS. 3 and 4 may be utilized relative to all compensator lines and wordlines across a memory array. For instance, in the embodiment of FIGS. 1 and 2, the compensator line 1 and associated wordline WL1 may have operational relationships of the type described with reference to either FIG. 3 or FIG. 4; and similarly, the compensator line 2 and associated wordline WL2 may also have operational relationships of the type described with reference to either FIG. 3 or FIG. 4.

Compensator lines of the type described herein may be utilized relative to wordlines in any application in which the compensator lines are found to beneficially enable tailoring (e.g. optimization) of performance of the wordlines and/or structures and devices associated with wordlines (e.g., access transistors). Such may include utilization in memory arrays, sensors, etc.

The apparatuses and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an apparatus which has a wordline coupled with a transistor gate, and which has a compensator line extending along the wordline and spaced from the wordline by a dielectric region. The compensator line is not electrically connected to the wordline. A driver is coupled with the wordline, and a controller is coupled with the compensator line.

Some embodiments include an apparatus having a wordline coupled with access transistors. A compensator line extends along the wordline, and is spaced from the wordline by a dielectric region. The compensator line is not electrically connected to the wordline. The compensator line, dielectric region and wordline together form a stack. The stack has a first vertical thickness, the wordline has a second vertical thickness, the compensator line has a third vertical thickness, and the dielectric region has a fourth vertical thickness. The third vertical thickness is within a range of from about 10% to about 50% of the first vertical thickness. The wordline is operated at a first voltage while the access transistors are in an OFF state. The compensator line is operated at a second voltage while the wordline is operated at the first voltage. The second voltage is greater than the first voltage.

Some embodiments include an apparatus having first and second trenches extending into a semiconductor material. the first and second trenches are lined with dielectric material. A first transistor gate is in the first lined trench, and a second transistor gate is in the second lined trench. The first transistor gate is coupled with a first wordline, and the second transistor gate is coupled with a second wordline. First, second and third source/drain regions are within the semiconductor material. The first transistor gate is between the first and second source/drain regions, and the second transistor gate is between the second and third source/drain regions. A first programmable structure is coupled with the first source/drain region, and a second programmable structure is coupled with the third source/drain region. A bitline is coupled with the second source/drain region. A first compensator line extends along the first wordline, and is spaced from the first wordline by a first dielectric region. The first compensator line is not electrically connected to the first wordline. A second compensator line extends along the second wordline, and is spaced from the second wordline by a second dielectric region. The second compensator line is not electrically connected to the second wordline.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An apparatus, comprising:
first and second trenches extending into a semiconductor material; the first and second trenches being lined with dielectric material;
a first transistor gate in the first lined trench, and a second transistor gate in the second lined trench; the first transistor gate being coupled with a first wordline, and the second transistor gate being coupled with a second wordline;
first, second and third source/drain regions within the semiconductor material; with the first transistor gate being between the first and second source/drain regions, and with the second transistor gate being between the second and third source/drain regions;
a first programmable structure coupled with the first source/drain region, and a second programmable structure coupled with the third source/drain region;
a bitline coupled with the second source/drain region;
a first compensator line within the first trench and extending along the first wordline, and spaced from the first wordline by a first dielectric region; the first compensator line not being electrically connected to the first wordline; and
a second compensator line within the second trench and extending along the second wordline, and spaced from the second wordline by a second dielectric region; the second compensator line not being electrically connected to the second wordline.

2. The apparatus of claim 1 wherein the first and second programmable structures are charge-storage devices.

3. The apparatus of claim 1 wherein the first and second programmable structures are capacitors.

4. The apparatus of claim 1 wherein:
the first source/drain region, second source/drain region and first transistor gate are together comprised by a first access transistor;
the second source/drain region, third source/drain region and second transistor gate are together comprised by a second access transistor;
the first wordline is operated at a first voltage while the first access transistor is in an OFF state, and the first compensator line is operated at a second voltage while the first wordline is operated at the first voltage; with the second voltage being greater than the first voltage; and
the second wordline is operated at the first voltage while the second access transistor is in an OFF state, and the second compensator line is operated at the second voltage while the second wordline is operated at the first voltage.

5. The apparatus of claim 4 wherein:
the first wordline is operated at a third voltage while the first access transistor is in an ON state, and the first compensator line is operated at the second voltage while the first wordline is operated at the third voltage; with the third voltage being greater than the second voltage; and
the second wordline is operated at the third voltage while the second access transistor is in an ON state, and the second compensator line is operated at the second voltage while the second wordline is operated at the third voltage.

6. The apparatus of claim 4 wherein:
the first wordline is operated at a third voltage while the first access transistor is in an ON state, and the first compensator line is operated at a fourth voltage while the first wordline is operated at the third voltage; with the third voltage not being greater than the fourth voltage; and the second wordline is operated at the third voltage while the second access transistor is in an ON state, and the second compensator line is operated at the fourth voltage while the second wordline is operated at the third voltage.

7. An apparatus, comprising:

a trench extending into a semiconductor material;

a transistor gate in the trench and coupled with a wordline;

a driver coupled with the wordline;

first and second source/drain regions within the semiconductor material; with the transistor gate being between the first and second source/drain regions;

a bitline coupled with the second source/drain region;

a compensator line within the trench and extending along the wordline, and spaced from the wordline by a dielectric region; the compensator line being coupled to a controller and being controlled independently relative to the wordline.

8. The apparatus of claim 7 further comprising a programmable structure coupled with the first source/drain region.

9. The apparatus of claim 8 wherein the programmable structure is a charge-storage device.

10. The apparatus of claim 8 wherein the programmable structure is a capacitor.

11. The apparatus of claim 7 wherein:

the first source/drain region, second source/drain region and transistor gate are together comprised by an access transistor; and the wordline is operated at a first voltage while the access transistor is in an OFF state, and the compensator line is operated at a second voltage while the wordline is operated at the first voltage; with the second voltage being greater than the first voltage.

12. The apparatus of claim 11 wherein:

the wordline is operated at a third voltage while the access transistor is in an ON state, and the compensator line is operated at the second voltage while the wordline is operated at the third voltage; with the third voltage being greater than the second voltage.

13. An apparatus, comprising:

a trench extending into a semiconductor material;

a stack of materials within the trench, the stack comprising a wordline, a dielectric material and a compensator line, the wordline being separated from the compensator line by the dielectric material;

a first source/drain region within the semiconductor material on a first side of the trench;

a second source/drain region within the semiconductor material on an opposing second side of the trench, the second source/drain region extending deeper into the semiconductor material than the first source/drain region;

a bitline coupled to the second source/drain region; and a programmable structure coupled to the first source/drain region.

14. The apparatus of claim 13 wherein the wordline comprises a first conductive material comprising one or both of tungsten and ruthenium.

15. The apparatus of claim 14 wherein the compensator line comprises a second conductive material comprising one or both of tungsten and ruthenium.

16. The apparatus of claim 13 further comprising a driver coupled with the wordline and a controller coupled with the compensator line, wherein the compensator line is independently controlled relative to the wordline.

17. The apparatus of claim 16 wherein the compensator line is operated by the controller at a second voltage while the wordline is operated at a first voltage; the second voltage being greater than the first voltage.

18. The apparatus of claim 13 wherein the compensator line electrically floats.

19. The apparatus of claim 13 wherein the compensator line is coupled to an electrically grounded structure.

* * * * *